(12) United States Patent
Takeda (10) Patent No.: US 7,994,782 B2
(45) Date of Patent: Aug. 9, 2011

(54) MAGNETIC DETECTION CIRCUIT (75) Inventor: Toru Takeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 406 days.

(21) Appl. No.: 12/341,912

(22) Filed: Dec. 22, 2008

(65) Prior Publication Data

US 2009/0174401 A1  Jul. 9, 2009

(30) Foreign Application Priority Data

Dec. 26, 2007  (JP) ................. 2007-334739

(51) Int. Cl.
*G01R 33/07* (2006.01)
*G01R 33/02* (2006.01)

(52) U.S. Cl. ........................... 324/251; 324/244

(58) Field of Classification Search .......... None
See application file for complete search history.

(56) References Cited

U.S. PATENT DOCUMENTS

| | | | | |
|---|---|---|---|---|
| 4,008,432 | A * | 2/1977 | Sugisaki et al. | 324/207.16 |
| 4,853,620 | A * | 8/1989 | Halder et al. | 324/142 |
| 6,653,831 | B2 * | 11/2003 | Friend et al. | 324/244 |
| 6,794,863 | B2 | 9/2004 | Hatanaka | |
| 2008/0197834 | A1 | 8/2008 | Takeda | |

FOREIGN PATENT DOCUMENTS

| | | |
|---|---|---|
| JP | 2000-174254 | 6/2000 |
| JP | 2003-043123 | 2/2003 |
| JP | 2008032424 | 2/2008 |

* cited by examiner

*Primary Examiner* — Paresh Patel
(74) *Attorney, Agent, or Firm* — Turocy & Watson, LLP (57) ABSTRACT

A magnetic detection element is employed. An output voltage from the magnetic detection element is amplified by an amplifying circuit. A switch circuit is connected between the magnetic detection element and the amplifying circuit. The switch circuit reverses the polarity of the output voltage from the magnetic detection element selectively and inputs an output signal to the amplifying circuit. A comparator compares the output signal from the amplifying circuit and a reference value to output a comparison result. First and second storage circuits are provided to receive output signal from the comparator. An electric power control unit controls at least the electric power to be provided to the magnetic detection element. First and second gated signals are provided to the first and second storage circuits respectively. A signal based on the first and second gated signals is supplied to the electric power control unit.

20 Claims, 7 Drawing Sheets

MAGNETIC DETECTION CIRCUIT

CROSS REFERENCE TO RELATED APPLICATION

This application is based upon and claims the benefit of priority from the prior Japanese Patent Application No. 2007-334739, filed on Dec. 26, 2007, the entire contents of which are incorporated herein by reference.

FIELD OF THE INVENTION

The invention relates to a magnetic detection circuit employing a magnetic detection element.

DESCRIPTION OF THE BACKGROUND

A digital magnetic sensor employing a Hall element has been widely used in order to detect whether an apparatus is in an open state or a closed state, for example. The digital magnetic sensor can detect a magnetic field intensity corresponding to each polarity by the Hall element. Such a digital magnetic sensor is disclosed in Japanese Patent Application Publication Nos. 2003-43123 and 2000-174254.

The former Patent Application Publication discloses a magnetic sensor including a Hall element, which detects a magnetic field and converts the magnetic field into an electric signal. An output voltage from the Hall element is amplified by a voltage amplifier. The amplified signal amplified by the voltage amplifier is inputted to a voltage comparator circuit. A switch circuit, which reverses a polarity of the amplified signal, is provided between the voltage amplifier and the voltage comparator circuit. An output signal from the voltage comparator circuit is held by a latch circuit.

The voltage comparator circuit reverses the polarity of a hysteresis voltage which determines a reference value of the magnetic field intensity. For the reversing operation, the voltage comparator circuit uses a first synchronous signal serving as a trigger to detect the magnetic field, and a second synchronous signal following the first synchronous signal.

The magnetic sensor continuously performs magnetic field detection operations of the S pole and of the N pole alternately according to the first and the second synchronous signals.

The latter Patent Application Publication discloses a semiconductor integrated circuit for magnetic detection. The semiconductor integrated circuit includes a Hall element to obtain a voltage output corresponding to the magnetic field intensity. Electric power is intermittently supplied to the Hall element from a power supply circuit. The output from the Hall element is compared with a reference corresponding to a magnetic field having a predetermined intensity by a comparator circuit.

The comparator circuit outputs a signal indicating a comparison result. The output from the comparator circuit is stored in a latch circuit, and is held while the electric power supply is suspended. The semiconductor integrated circuit performs intermittently magnetic field detection operations of the S pole, and of the N pole alternately.

Each of the magnetic sensor and the semiconductor integrated circuit shown in the above-described Patent Application Publications can detect magnetism, even if the magnetic field of either the S pole or the N pole is applied to the Hall element.

Even when the magnetic field of either the S pole or the N pole is continuously applied to the Hall elements, detections of the magnetic field for the other polarity are made. Thus, useless electric power is consumed in the magnetic sensor and the semiconductor integrated circuit.

In particular, the power consumption of a mobile information terminal device such as a mobile phone has been increasing along with the advancement of higher functional mobile information terminal devices with higher performance. Such a mobile information terminal device, which consumes as little electric current as possible, is required in order to be used for a long time.

SUMMARY OF THE INVENTION

An aspect of the present invention provides a magnetic detection circuit to detect a magnetic field of a first polarity and a magnetic field of a second polarity, the magnetic detection circuit including a magnetic detection unit and a detection operation control unit, wherein the magnetic detection unit performs first and second magnetic field detection operations, the first magnetic field detection operation is that a magnetic field is detected according to a first control signal, that whether or not the detected magnetic field is of the first polarity is determined to obtain a first detection result, and that a signal showing the first detection result is stored, the second magnetic field detection operation is that the magnetic field is detected according to a second control signal, that whether or not the detected magnetic field is of the second polarity is determined to obtain a second detection result, and that a signal showing the second detection result is stored, the detection operation control unit gates the first control signal and the second control signal so as to allow both of the first and the second magnetic field detection operations to be performed, when both of the signal showing the first detection result and the signal showing the second detection result indicate that the magnetic field is not detected, and further the detection operation control unit gates the first control signal and the second control signal so as to allow only the detection operation of the magnetic field of the detected polarity to be performed, when either one of the signal showing the first detection result and the signal showing the second detection result shows that the magnetic field is detected.

An aspect of the present invention provides a magnetic detection circuit including a magnetic detection element to detect a magnetic field of a first polarity and a magnetic field of a second polarity to output an electric signal, an amplifying circuit to amplify the output signal from the magnetic detection element, a switch circuit connected between the magnetic detection element and the amplifying circuit, the switch circuit selectively reversing the polarity of the output voltage from the magnetic detection element to input the output voltage with the reversed polarity to the amplifying circuit, a comparator to compare the output signal from the amplifying circuit and a reference value, first and second storage circuits to receive an output signal from the comparator, the first and second storage circuits respectively outputting first and second output signals, an output circuit to output a magnetic field detection signal based on the first and the second output signals, an electric power control unit to control at least the electric power to be provided to the magnetic detection element, a first control circuit to receive a first control signal and the second output signal, the first control circuit generating a first gated signal, and a second control circuit to receive a second control signal and the first output signal, the second control circuit generating a second gated signal, wherein the first and the second control signals are generated intermittently and alternately, the first and the second gated signals are respectively inputted to the first and the second storage circuits in order to control the first and the second storage circuits, a first signal based on the first and the second gated signals is supplied to the electric power control unit to control the electric power control unit, and the switch circuit is switched by a second signal corresponding to at least one of the first or the second control signals.

DETAILED DESCRIPTION OF THE INVENTION

Embodiments of the invention will be described hereinafter with reference to the drawings. The embodiments show a magnetic detection circuit which detects three states of magnetic fields. One of the three states is that a magnetic field of the N pole exists. The N pole is a first polarity. Another one of the three states is that a magnetic field of the S pole exists. The S pole is a second polarity. The rest one of the three states is that magnetic field does not exist. "The existence of the magnetic field of the N pole" shows that the N pole is present in the vicinity. "The existence of the magnetic field of the S pole" shows that the S pole is present in the vicinity. "The non-existence of the magnetic field" shows that neither the N pole nor the S pole is present in the vicinity.

Figure 1:
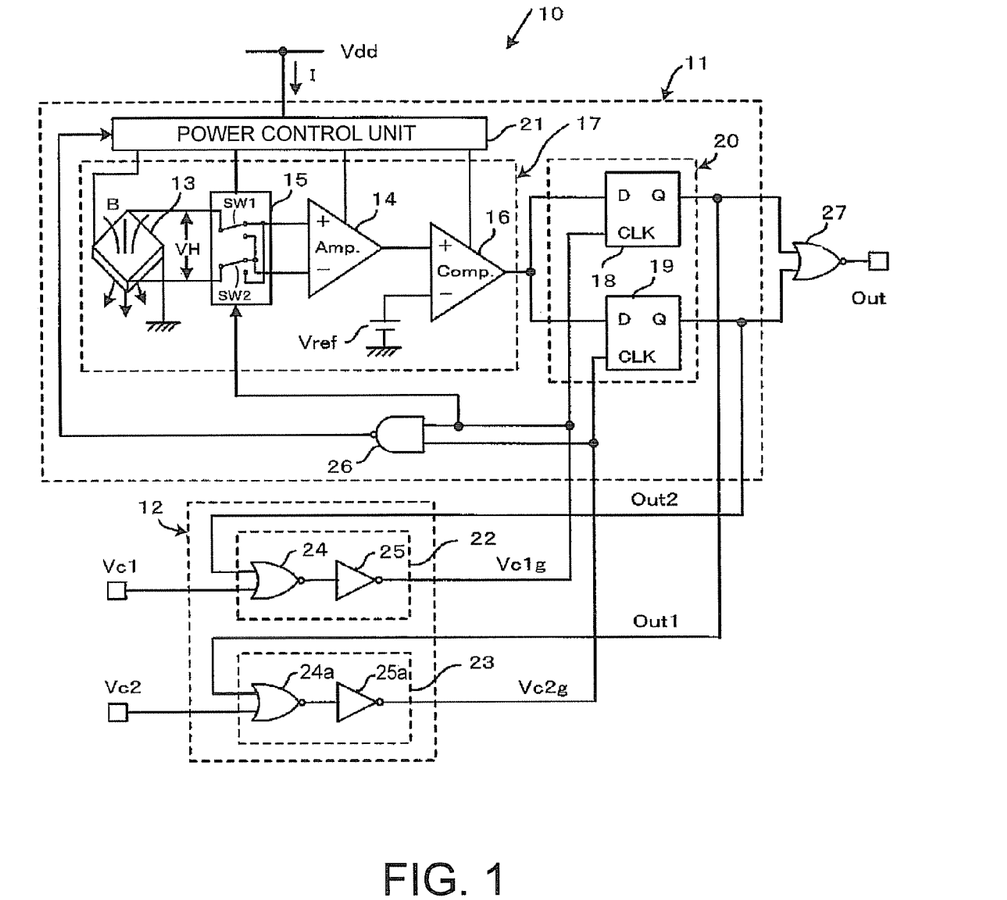
FIG. 1 is a circuit diagram showing a magnetic detection circuit according to a first embodiment of the invention.
Figure 2:
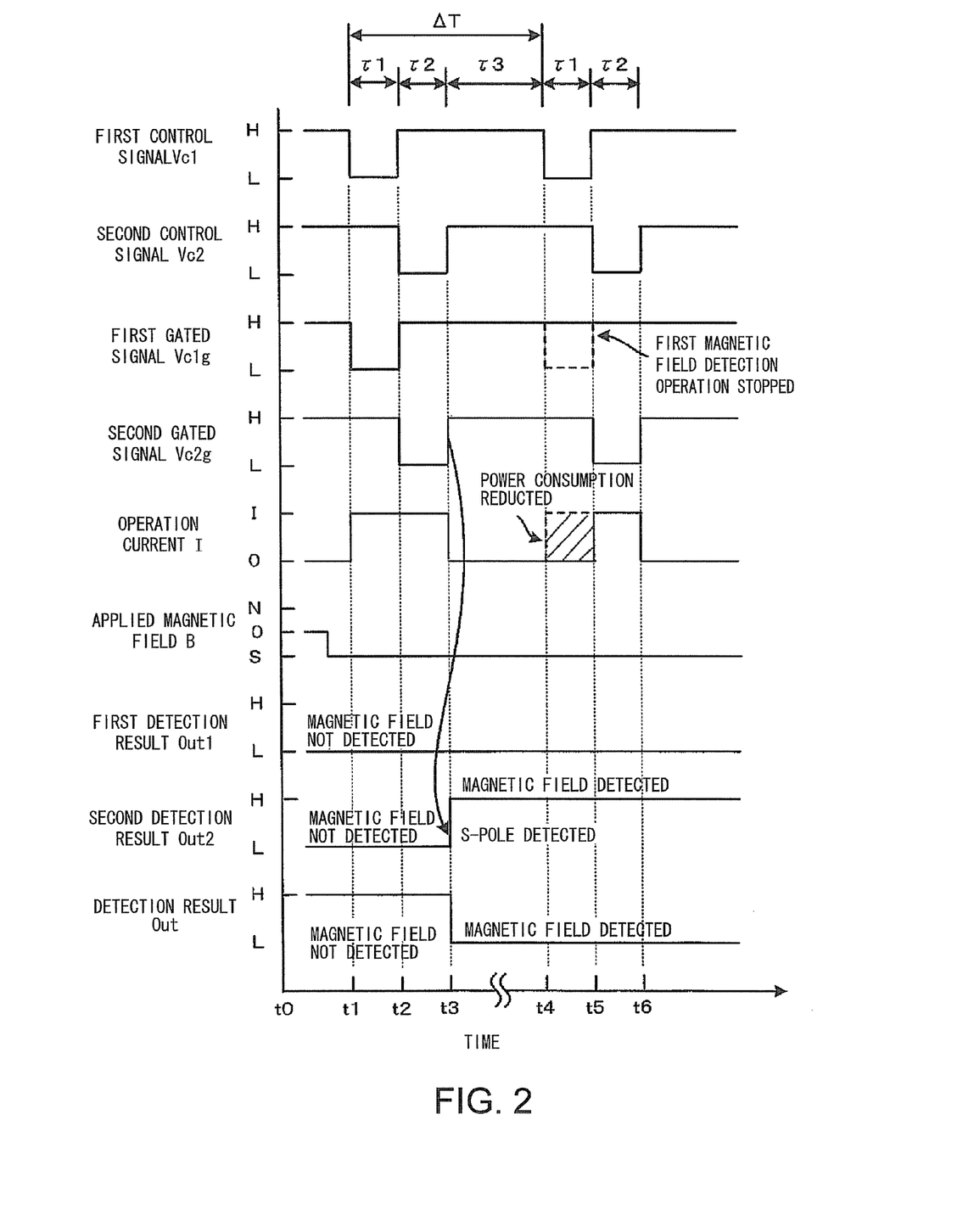
FIGS. 2 to 4 are timing charts showing operations of the magnetic detection circuit according to the first embodiment.
Figure 3:
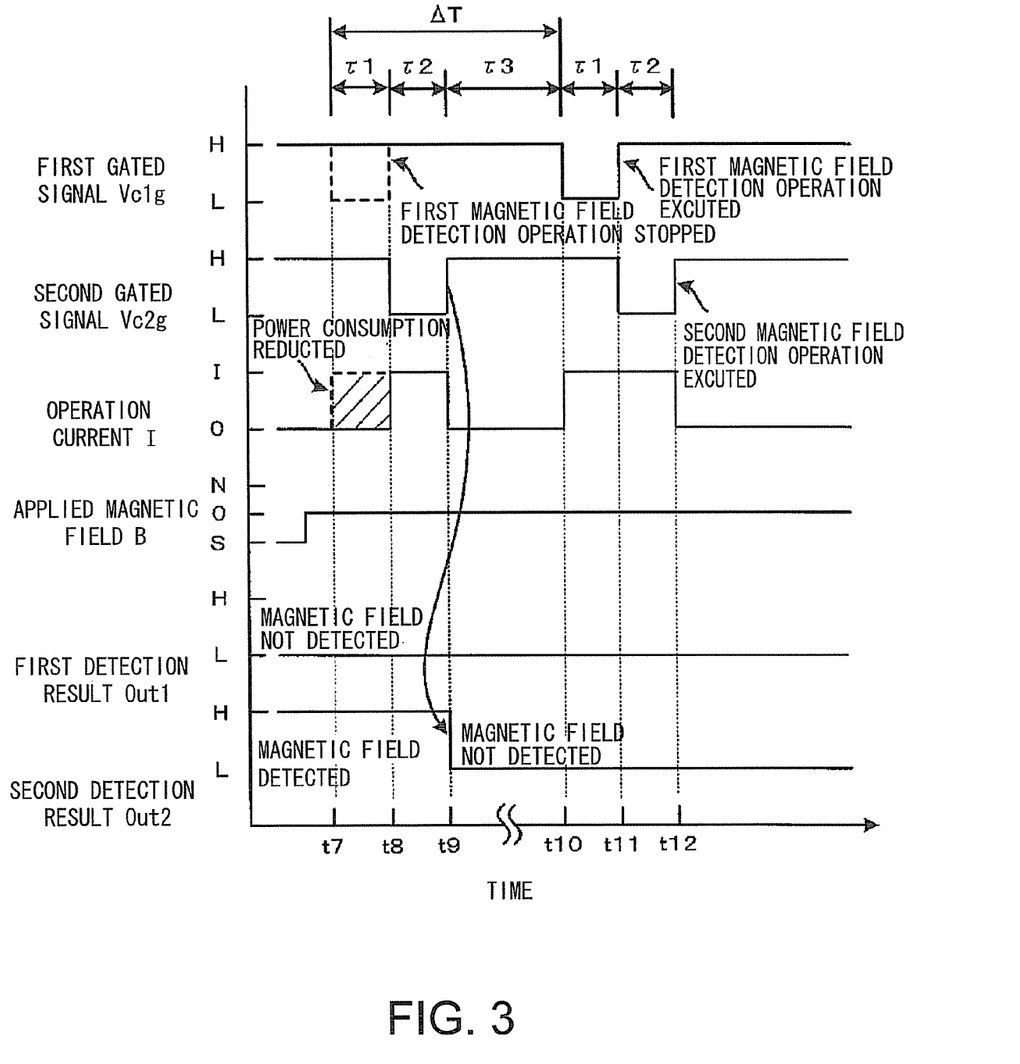
Figure 4:
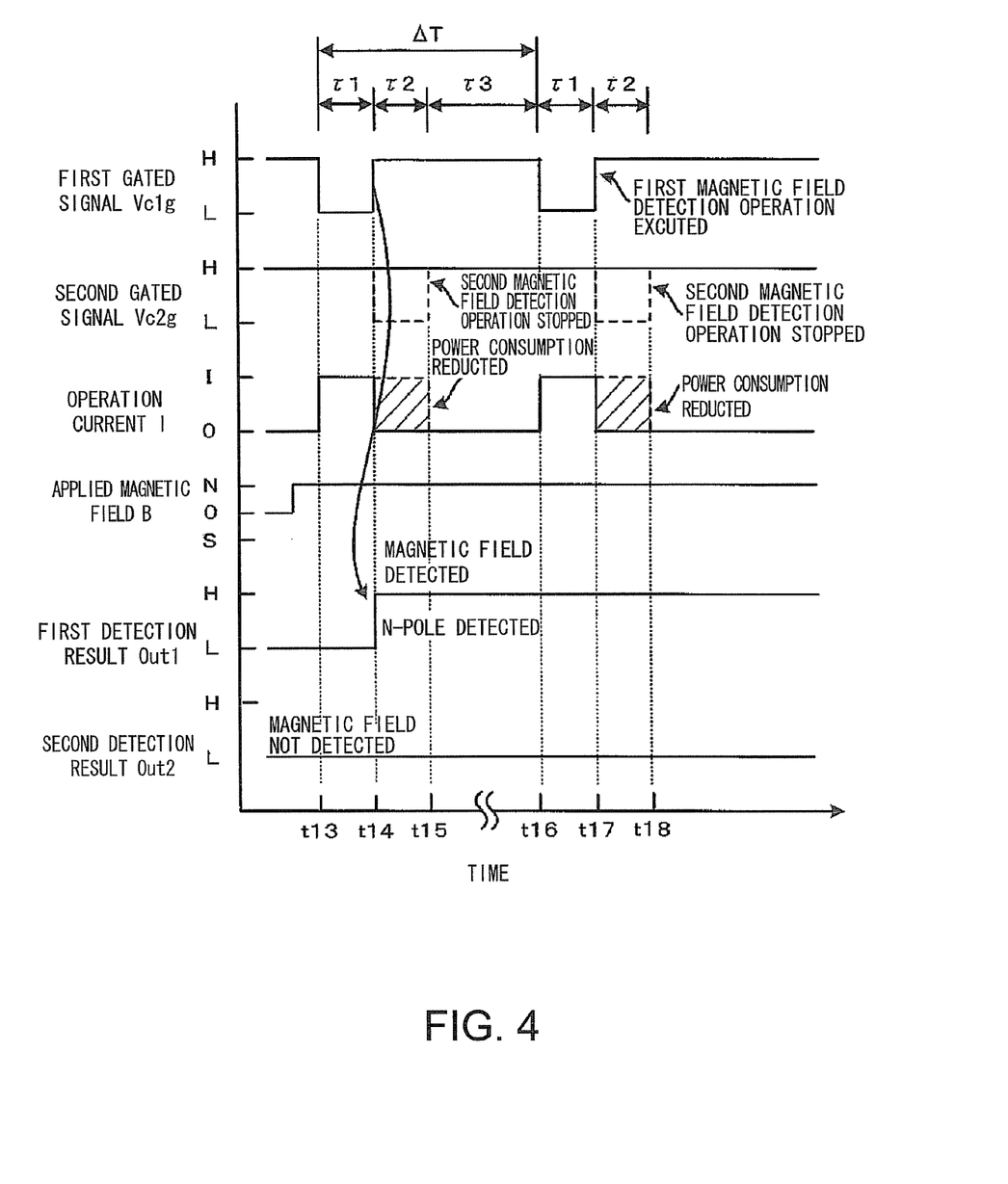

A first embodiment of the invention will be described with reference to FIGS. 1 to 4. FIG. 1 is a circuit diagram showing a magnetic detection circuit according to the first embodiment. FIGS. 2 to 4 are timing charts showing operations of the magnetic detection circuit according to the first embodiment.

As shown in FIG. 1, a magnetic detection circuit 10 according to the embodiment includes a magnetic detection unit 11 and a detection operation control unit 12. The magnetic detection unit 11 includes a magnetic detection portion 17, a detection result storage unit 20, an electric power control unit 21, and an NAND circuit 26.

The magnetic detection unit 11 performs a first magnetic field detection operation and a second magnetic field detection operation.

The first magnetic field detection operation is that a magnetic field B is detected according to a first control signal Vc1 and a second control signal Vc2, that whether or not the magnetic field B is a magnetic field of the N pole is determined to obtain a first detection result, and that a signal Out1 showing the first detection result is stored.

The second magnetic field detection operation is that a magnetic field B is detected, that whether or not the magnetic field B is a magnetic field of the S pole is determined to obtain a second detection result, and that a signal Out2 showing the second detection result is stored.

When both of the signal Out1 showing the first detection result and the signal Out2 showing the second detection result indicate that a magnetic field is not detected, the detection operation control unit 12 gates the first control signal Vc1 and the second control signal Vc2 so as to perform both of the first and the second magnetic field detection operations. When either one of the signal Out1 showing the first detection result and the signal Out2 showing the second detection result indicates that a magnetic field is detected ("H" level), the detection operation control unit 12 gates the first control signal Vc1 and the second control signal Vc2 so as to perform only a detection operation of the detected magnetic field.

The above-described magnetic detection portion 17 includes a Hall element 13, an amplifying circuit 14, a switch circuit 15, and a comparator 16. The Hall element 13 is a magnetic detection element. The Hall element 13 generates a Hall voltage VH according to a magnetic flux density of the magnetic field B. The amplifying circuit 14 amplifies the output voltage VH of the Hall element 13. The switch circuit 15 is connected between the Hall element 13 and the amplifying circuit 14. The switch circuit 15 reverses the connection between the Hall element 13 and the amplifying circuit 14 according to the first and the second magnetic field detection operations. The comparator 16 compares an output from the amplifying circuit 14 and a reference value Vref. The comparator 16 outputs a comparison result.

The detection result storage unit 20 includes a first flip-flop (first storage circuit) 18 which stores the signal Out1 showing the first detection result. The detection result storage unit 20 further includes a second flip-flop (second storage circuit) 19 which stores the signal Out2 showing the second detection result. The first and the second flip-flops 18, 19 are D type flip-flops, and operate as the first and the second storage circuits. The signal Out1 showing the first detection result is a first output signal of the first flip-flop 18. The signal Out2 showing the second detection result is a second output signal of the second flip-flop 19.

The electric power control unit 21 reduces or stops the electric power supplied to the magnetic detection portion 17, while the first and the second magnetic field detection operations are not performed.

The detection operation control unit 12 includes first and second control circuits 22, 23. The first control circuit 22 gates the first control signal Vc1 according to the signal Out2 showing the second detection result. The second control circuit 23 gates the second control signal Vc2 according to the signal Out1 showing the first detection result.

The first control circuit 22 is a circuit which outputs the first control signal Vc1 when the signal Out2 showing the second detection result indicates that a magnetic field is not detected ("L" level). The second control circuit 23 is a circuit which outputs the second control signal Vc2 when the signal Out1 showing the first detection result indicates that a magnetic field is not detected ("L" level).

The first and the second control circuits 22, 23 perform a negative logic operation to become active when the first control signal Vc1 and the second control signal Vc2 are at the "L" level.

The first control circuit 22 includes an NOR circuit 24 and an inverter 25. The first control signal Vc1 is inputted to one input terminal of the NOR circuit 24. The signal Out2 showing the second detection result is inputted to the other input terminal of the NOR circuit 24. An output from the NOR circuit 24 is inputted to the inverter 25.

Similarly, the second control circuit 23 includes an NOR circuit 24a and an inverter 25a.

The second control signal Vc2 is inputted to one of input terminals of the NOR circuit 24a. The signal Out1 showing the first detection result is inputted to the other one of the input terminals of the NOR circuit 24a. An output from the NOR circuit 24a is inputted to the inverter 25a.

When the signal Out2 showing the second detection result is at the "L" level and when the first control signal Vc1 becomes the "L" level, a first gated signal Vc1g, which is an output from the first control circuit 22, becomes the "L" level so that the first control signal Vc1 propagates.

Similarly, when the signal Out1 showing the first detection result is at the "L" level and when the second control signal Vc2 becomes the "L" level, a second gated signal Vc2g, which is an output from the second control circuit 23, becomes the "L" level so that the second control signal Vc2 propagates.

The Hall element 13 is a GaAs Hall sensor having four geometrically equivalent terminals, for example. When a current is passed between one pair of terminals of the four terminals, which are located diagonally opposite to each other, the Hall element 13 generates the Hall voltage VH of the polarity corresponding to the magnetic field B between the other pair of terminals which intersects perpendicularly with the one pair of terminals.

The switch circuit 15 includes switch elements SW1, SW2 which operate according to the first gated signal Vc1g. The switch elements SW1, SW2 are analog CMOS switch elements, for example. The switch circuit 15 reverses the connection so that the positive voltage of the Hall voltage VH is inputted to a positive input terminal of the amplifying circuit 14, even if the magnetic field B with either one of the N pole and the S pole is applied to the Hall element 13.

When the output from the amplifying circuit 14 is larger than a reference voltage Vref, the comparator 16 determines that a magnetic field is detected to output the signal of the "H" level.

The electric power control unit 21 is connected between a power supply Vdd and the magnetic detection portion 17. The electric power control unit 21 includes an MOS transistor for switching (not shown). The first gated signal Vc1g and the second gated signal Vc2g are inputted to the NAND circuit 26. The MOS transistor of the electric power control unit 21 is turned on or turned off upon receipt of an output from the NAND circuit 26.

An output terminal of the comparator 16 is connected to input terminals D, D of the first and the second flip-flops 18, 19 in the detection result storage unit 20. The first gated signal Vc1g is inputted to a clock terminal CLK of the first flip-flop 18. The first flip-flop 18 latches the output from the comparator 16 in response to the rising edge of the first gated signal Vc1g from the "L level" to the "H" level, and outputs the signal Out1 showing the first detection result to an output terminal Q of the first flip-flop 18.

Similarly, the second gated signal Vc2g is inputted to a clock terminal CLK of the second flip-flop 19. The second flip-flop 19 latches the output from the comparator 16 in response to the rising edge of the second gated signal Vc2g from the "L" level" to the "H" level, and outputs the signal Out2 showing the second detection result to an output terminal Q of the second flip-flop 19.

The signals Out1, Out2 respectively showing the first and the second detection results are outputted to outside by an NOR circuit 27 as a detection result Out of a negative logic signal without a polarity. The NOR circuit 27 is an output circuit which outputs a signal showing a detection result.

When the first gated signal Vc1g or the second gated signal Vc2g is at the "L" level, an output from the NAND circuit 26 becomes the "H' level. Consequently, the MOS transistor of the electric power control unit 21 is turned on and an operation current I is supplied to the magnetic detection portion 17. Then the magnetic detection unit 11 performs the first magnetic field detection operation or the second magnetic field detection operation.

When the first gated signal Vc1g and the second gated signal Vc2g are at the "H" level, the output from the NAND circuit 26 becomes the "L" level. Consequently, the MOS transistor of the electric power control unit 21 is turned off. Since the operation current I to the magnetic detection portion 17 is cut off, the magnetic detection unit 11 pauses the magnetic field detection operation.

FIGS. 2 to 4 are timing charts showing operations of the above-described magnetic detection circuit 10. FIG. 2 is a timing chart when a magnetic field of the S pole is applied. FIG. 3 is a timing chart when the magnetic field of the S pole is no longer applied. FIG. 4 is a timing chart when a magnetic field of the N pole is applied.

As shown in FIG. 2, the first control signal Vc1 and the second control signal Vc2 are supplied to the magnetic detection circuit 10 in FIG. 1 intermittently and alternately.

The first control signal Vc1 is a rectangular wave signal of the negative logic having a pulse width $\tau 1$ in a cycle $\Delta T$. Similarly, the second control signal Vc2 is a rectangular wave signal of the negative logic having a pulse width $\tau 2$ in the cycle $\Delta T$. It is assumed that the pulse width $\tau 1$ and the pulse width $\tau 2$ are equal to each other in FIG. 2.

A period $\tau 1$ in which the first control signal Vc1 is at the "L" level is a first magnetic field detection operation period. A period $\tau 2$ in which the second control signal Vc2 is at the "L" level is a second magnetic field detection operation period. A period $\tau 3$ in which both of the first and the second control signals Vc1, Vc2 are at the "H" level is a magnetic field detection operation pause period. $\Delta T = \tau 1 + \tau 2 + \tau 3$ is a magnetic field detection cycle.

In an initial state where the magnetic field B is not applied to the Hall element 13 in FIG. 1, both of the signals Out1, Out2 respectively showing the first and the second detection results are at the "L" level (a magnetic field is not detected).

When the magnetic field B of the S pole is applied in a period between times t0 to t1 and the first control signal Vc1 becomes the "L" level at the time t1, the first control circuit 22 gates the first control signal Vc1. Since the signal Out2 showing the second detection result is at the "L" level, the first gated signal Vc1g becomes the "L" level.

The NAND circuit 26 outputs the "H" level so that the electric power control unit 21 is driven. Consequently, the operation current I is supplied to the magnetic detection portion 17, and the first magnetic field detection operation is performed. At the time, the current I is consumed in the magnetic detection portion 17.

Since the magnetic field of the N pole is not detected after the first magnetic field detection operation, the signal Out1 showing the first detection result keeps the "L" level.

Thereafter, when the second control signal Vc2 becomes the "L" level at time t2, the second control circuit 23 gates the second control signal Vc2. Consequently, since the signal Out1 showing the first detection result is at the "L" level, the second gated signal Vc2g becomes the "L" level.

Therefore, the NAND circuit 26 outputs the "H" level so that the electric power control unit 21 is driven.

Accordingly, the operation current I is supplied to the magnetic detection portion 17, and the second magnetic field detection operation is performed. At the time, the current I is consumed in the magnetic detection portion 17.

Since the magnetic field of the S pole is detected by the above-described second magnetic field detection operation, the second gated signal Vc2g rises from the "L" level to the "H" level. At the rising time t3, the signal Out2 showing the second detection result becomes the "H" level.

Thereafter, when the first control signal Vc1 becomes the "L" level at time t4, the signal Out2 showing the second detection result is at the "H" level. Accordingly, the first gated signal Vc1g remains at the "H" level.

Therefore, the NAND circuit 26 outputs the "L" level. Consequently, the electric power control unit 21 is driven to stop supplying the operation current I to the magnetic detection portion 17. Accordingly, the first magnetic field detection operation is not performed.

As long as the magnetic field B of the S pole is being applied, the signal Out1 showing the first detection result remains at the "L" level, even after the first magnetic field detection operation is performed. Thus, the pause of the first detection operation causes the operation current I to stop consuming waste power.

Thereafter, when the second control signal Vc2 becomes the "L" level at time t5, since the signal Out1 showing the first detection result is at the "L" level, the second gated signal Vc2g becomes the "L" level.

Therefore, the NAND circuit 26 outputs the "H" level, the electric power control unit 21 is driven, the operation current I is supplied to the magnetic detection portion 17, and the second magnetic field detection operation is performed.

It is possible to check at the time t5 whether or not the magnetic field B of the S pole has been applied during the magnetic field detection operation pause period between the times t3, t4.

FIG. 3 is the timing chart showing a case where the magnetic field B of the S pole is not applied during the magnetic field detection operation pause period between times t6, t7. The first and the second control signals Vc1, Vc2 are not shown in FIG. 3.

As shown in FIG. 3, when the first control signal Vc1 becomes the "L" level at the time t7, the signal Out2 showing the second detection result keeps the "H" level. Accordingly, the first gated signal Vc1g is kept at the "H" level. Consequently, since the first magnetic field detection operation is not performed, power is saved without being consumed by the operation current I.

Thereafter, the second control signal Vc2 becomes the "L" level at time t8, the signal Out1 showing the first detection result keeps the "L" level. Accordingly, the second gated signal Vc2g becomes the "L" level. Consequently, the second magnetic field detection operation is performed, and the operation current I is consumed in the magnetic detection portion 17.

Since the magnetic field of the S pole is not detected by the second magnetic field detection operation, the signal Out2 showing the second detection result becomes the "L" level, at time t9 in which the second gated signal Vc2g rises from the "L" level to the "H" level.

The operation between times t10, t12 is the same as the operation between the times t1, t3.

FIG. 4 is the timing chart when the magnetic field B of the N pole is applied during the magnetic field detection operation pause period between times t12, t13. The first and the second control signals Vc1, Vc2 are not shown in FIG. 4.

As shown in FIG. 4, when the first control signal Vc1 becomes the "L" level at the time t13, the signal Out2 showing the second detection result is at the "L" level. Accordingly, the first gated signal Vc1g becomes the "L" level. Consequently, the first magnetic field detection operation is performed.

The magnetic field of the N pole is detected by the first magnetic field detection operation. Thus, the signal Out1 showing the first detection result becomes the "H" level at time t14 in which the first gated signal Vc1g rises from the "L" level to the "H" level.

Thereafter, when the second control signal Vc2 (not shown) becomes at the "L" level at time 14, the signal Out1 showing the first detection result is at the "H" level. Accordingly, the second gated signal Vc2g is kept at the "H" level. Therefore, since the second magnetic field detection operation is not performed, power is saved without being consumed by the useless operation current I.

The operation between times t16 to t18 is the same as the operation between the times t4 to t6.

Figure 5:
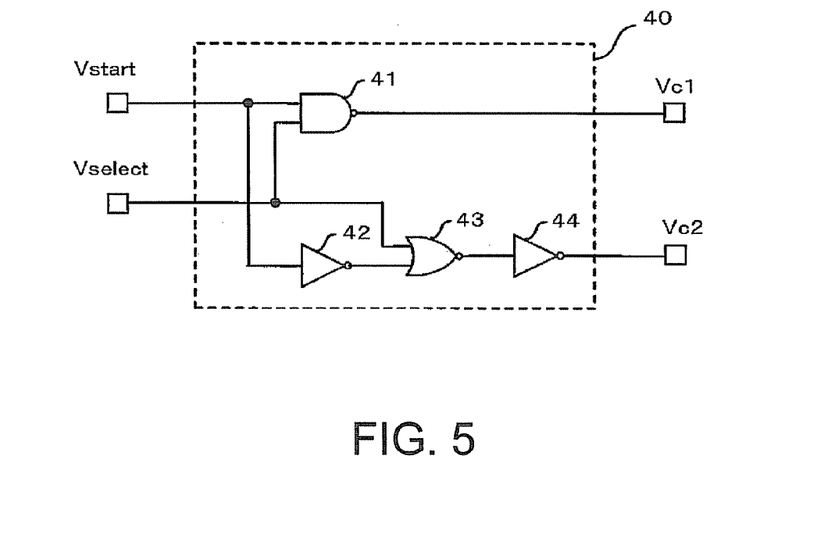
FIG. 5 is a circuit diagram showing a control signal generating circuit of the magnetic detection circuit according to the first embodiment.
Figure 6:
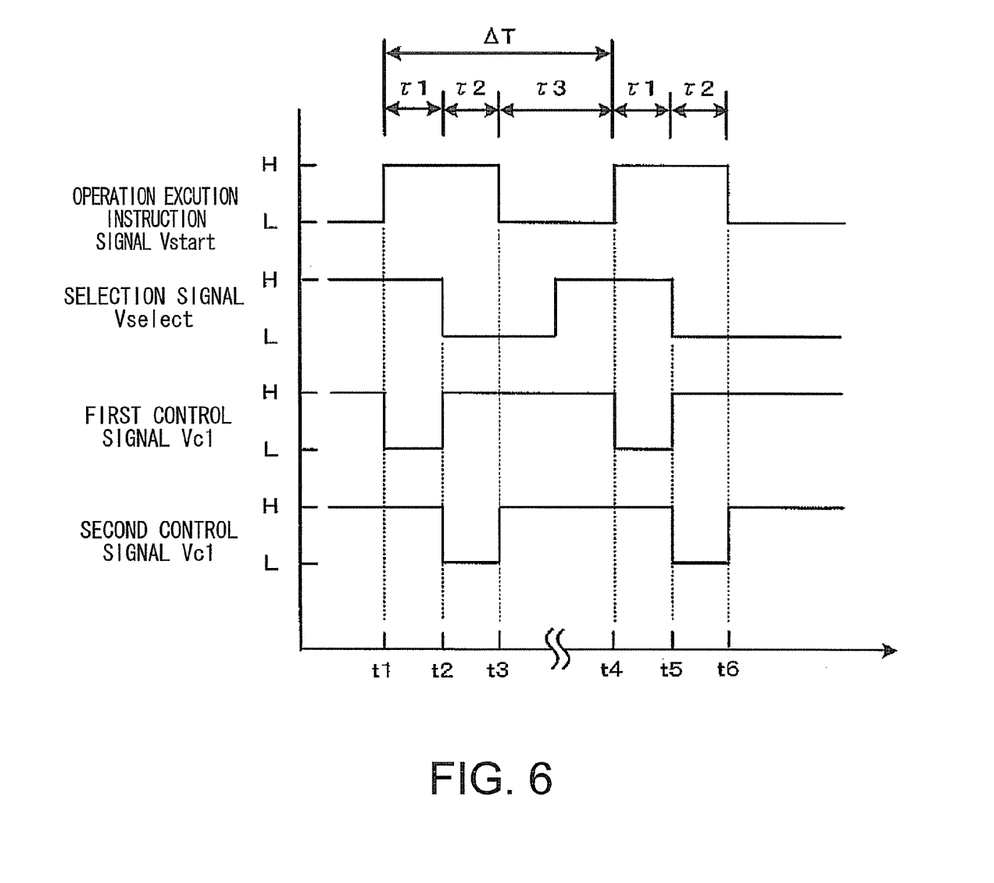
FIG. 6 is a timing chart showing an operation of the control signal generating circuit of FIG. 5.

FIG. 5 is a circuit diagram showing an example of the control signal generating circuit which generates the first and the second control signals Vc1, Vc2. FIG. 6 is a timing chart showing an operation of the control signal generating circuit.

As shown in FIG. 5, an operation execution instruction signal Vstart is inputted to one of input terminals of an NAND circuit 41 which constitutes a control signal generating circuit 40. A selection signal Vselect is inputted to the other one of the input terminals of the NAND circuit 41. The NAND circuit 41 outputs the first control signal Vc1.

The operation execution instruction signal Vstart is inputted to an inverter 42 which constitutes the control signal generating circuit 40. An output from the inverter 42 and the selection signal Vselect are inputted to input terminals of an NOR circuit 43, respectively. An output from the NOR circuit 43 is inputted to an inverter 44. The inverter 44 outputs the second control signal Vc2.

As shown in FIG. 6, the operation execution instruction signal Vstart is a rectangular wave having a pulse width $\tau1+\tau2$ in a cycle $\Delta T$. The selection signal Vselect is also a rectangular wave. The pulse width and the cycle of the selection signal Vselect are equal to the pulse width and the cycle of the operation execution instruction signal Vstart. The phase of the selection signal Vselect is shifted from the operation execution instruction signal Vstart by only $\tau1$.

When the operation execution instruction signal Vstart becomes the "H" level at the time t1, the selection signal Vselect keeps the "H" level. Accordingly, the first control signal Vc1 becomes the "L" level. The second control signal Vc2 keeps the "H" level.

Thereafter, when the selection signal Vselect becomes the "L" level at the time t2, the operation execution instruction signal Vstart keeps the "H" level. Accordingly, the first control signal Vc1 becomes the "H" level. The second control signal Vc2 becomes the "L" level.

When the operation execution instruction signal Vstart becomes the "L" level at the time t3, the selection signal Vselect keeps the "L" level. Accordingly, the first control signal Vc1 keeps the "H" level, and the second control signal Vc2 becomes the "H" level.

In this way, the first control signal Vc1 and the second control signal Vc2 of the negative logic, each of which has a pulse width $\tau1$ in a cycle $\Delta T$, are obtained, the first and the second control signals Vc1, Vc2 being supplied to the magnetic detection circuit 10 intermittently and alternately.

When both of the signal Out1 showing the first detection result and the signal Out2 showing the second detection result indicate that a magnetic field is not detected, the magnetic detection circuit 10 according to the embodiment performs both of the first and the second magnetic field detection operations. When either one of the signal Out1 showing the first detection result and the signal Out2 showing the second detection result indicates that a magnetic field is detected, the magnetic detection circuit 10 performs only the detection operation of the detected magnetic field. In order to carry out the execution, the first control signal Vc1 and the second control signal Vc2 are gated.

Consequently, in a state where a magnetic field is not detected, detection operations of a magnetic field of the N pole and a magnetic field of the S pole are performed intermittently and alternately in a conventional manner. Once the magnetic field is detected, control is made on a magnetic field having a polarity opposite to a polarity of the detected magnetic field so as not to perform detection.

In the embodiment, the number of the execution of the magnetic field detection operation becomes half while a magnetic field is being detected so that the useless operation current can be reduced. Thus, a magnetic detection circuit consuming less power can be obtained.

Usually, a foldable mobile information terminal is folded to be in a closed state, when not used (standby). The closed state is much longer than an opened state.

Such a mobile information terminal detects the opened state and the closed state using a magnet and a magnetic sensor. Employment of the embodiment contributes the reduction of the power consumption at the magnetic field detection operation in the closed state (a magnetic field is detected), and is effective for suppressing the consumption of a battery which drives the mobile information terminal.

The above-described embodiment shows the case where the electric power control unit 21 cuts off the operation current I of the magnetic detection portion 17 to zero. Alternatively, only the operation current of the Hall element 13 may be cut off, since the Hall element 13 consumes larger amount of electric current in the magnetic detection portion 17.

In the alternative way, the amplifying circuit 14, switch circuit 15, and the comparator 16 of the magnetic detection portion 17 always operate. Accordingly, the performance of the rising edge of the magnetic detection portion 17 can be improved, compared with the case where all the operation current I in the magnetic detection portion 17 is cut off.

Additionally, instead of the Hall element 13, other known magnetic detection elements, which detects static magnetic field and outputs a voltage, can be used.

In the above-described embodiment, a CMOS analog switch, for example is used as the switch elements SW1, SW2 of the switch circuit 15. The first gated signal Vc1g is inputted to the switch elements SW1, SW2. Since the CMOS analog switch requires no operation current, the first control signal Vc1 before gated may be inputted to the CMOS analog switch.

When the second control signal Vc2 is generated preceding the first control signal Vc1, unlike FIGS. 2 to 4, the second control signal Vc2 or the second gated signal Vc2g is supplied to the switch circuit 15. The First and the second control signals Vc1, Vc2 or the first and the second gated signals Vc1g, Vc2g may be supplied to the switch circuit 15.

In the magnetic detection circuit 10 according to the above-described embodiment, for example, when power is raised to be supplied, both of the signal Out1 showing the first detection result and the signal Out2 showing the second detection result may become the "H" level so that neither the first nor the second magnetic field detection operations may be performed.

Figure 7:
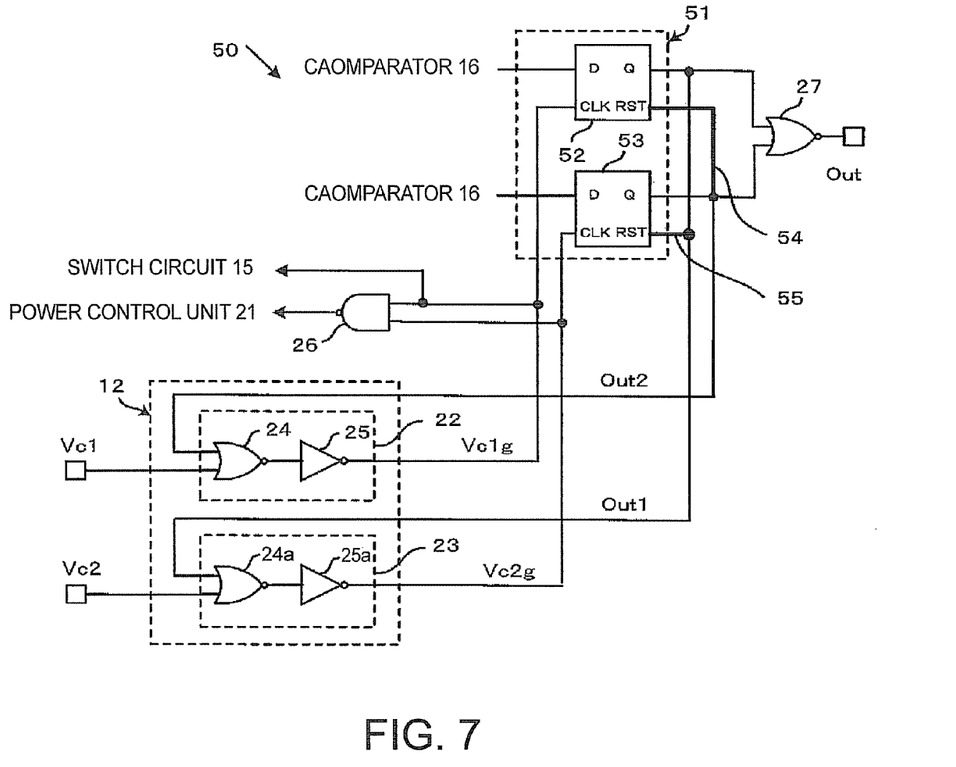
FIG. 7 is a circuit diagram showing a principal part of a modification of the magnetic detection circuit according to the first embodiment.

FIG. 7 is a circuit diagram showing a principal portion of a modification, in which the magnetic detection circuit according to the first embodiment is improved. The modification can prevent the magnetic detection operation from being stopped, which does not happen in normal operation.

In FIG. 7, the same reference numerals as in FIG. 1 show the same portions.

As shown in FIG. 7, a detection result storage unit 51 of a magnetic detection circuit 50 includes first and second flip-flops 52, 53, each of which has a reset terminal. The first and the second flip-flops 52, 53 are D type flip-flops each having a reset terminal.

The reset terminal of the first flip-flop 52 is connected to an output terminal of the second flip-flop 53 and the input terminal of the NOR circuit 24 through a wiring 54. Similarly, the reset terminal of the second flip-flop 53 is connected to an output terminal of the first flip-flop 53 and the input terminal of the NOR circuit 24a through a wiring 55.

The first flip-flop 52 is reset when the signal Out2 showing the second detection result becomes the "H" level so that the signal Out1 showing the first detection result can be forcedly changed to the "L" level.

Similarly, the second flip-flop 53 is reset when the signal Out1 showing the first detection result becomes the "H" level, the signal Out2 showing the second detection result can be forcedly changed to the "L" level.

Therefore, neither the signal Out1 showing first detection result nor the signal Out2 showing the second detection result becomes the "H" level. Accordingly, it is possible to prevent the magnetic detection operation from being stopped.

Figure 8:
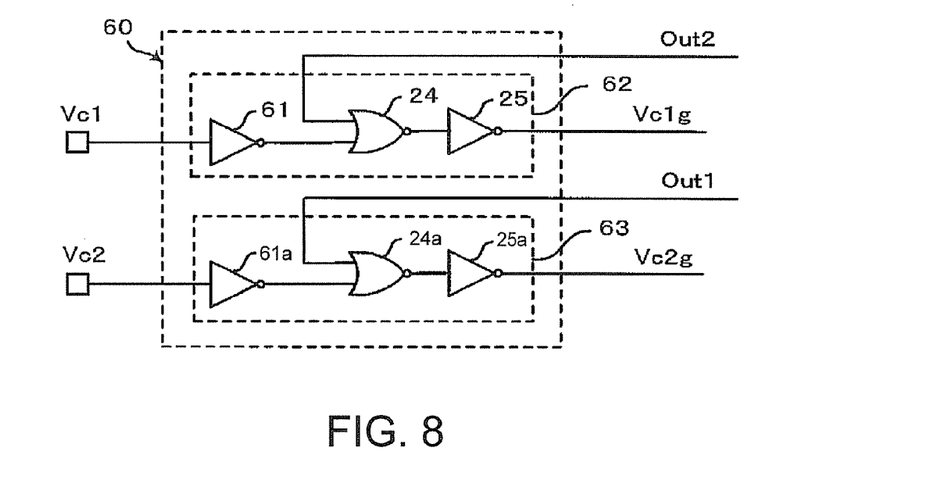
FIG. 8 is a circuit diagram showing a principal part of a magnetic detection circuit according to a second embodiment of the invention.

A magnetic detection circuit according to a second embodiment of the invention will be explained referring to FIG. 8. FIG. 8 is a circuit diagram showing a principal part of the magnetic detection circuit according to the second embodiment.

In FIG. 8, the same reference numerals as in FIG. 1 show the same portions.

In the embodiment, the first control signal Vc1 and the second control signal Vc2 are used as operation signals of positive logic.

As shown in FIG. 8, a detection operation control unit 60 of the magnetic detection circuit according to the embodiment includes a first control circuit 62 and a second control circuit 63.

The first control circuit 62 includes an inverter 61 which reverses a first control signal Vc1 of the positive logic and which supplies the reversed first control signal Vc1 to the NOR circuit 24. The second control circuit 63 includes an inverter 61a which reverses a second control signal Vc2 of the positive logic and which supplies the reversed second control signal Vc2 to the NOR circuit 24a.

Since the detection operation control unit 60 of the magnetic detection circuit according to the embodiment includes the inverters 61, 61a, the detection operation control unit 60 can operate the magnetic detection circuit by the first and the second control signals Vc1, Vc2 of the positive logic.

Moreover, the magnetic detection circuit can be operated whether the first and the second control signals Vc1, Vc2 are positive logic signals or positive logic signals, by providing switches which short-circuit input and output terminals of the inverters 61, 61a respectively.

Figure 9:
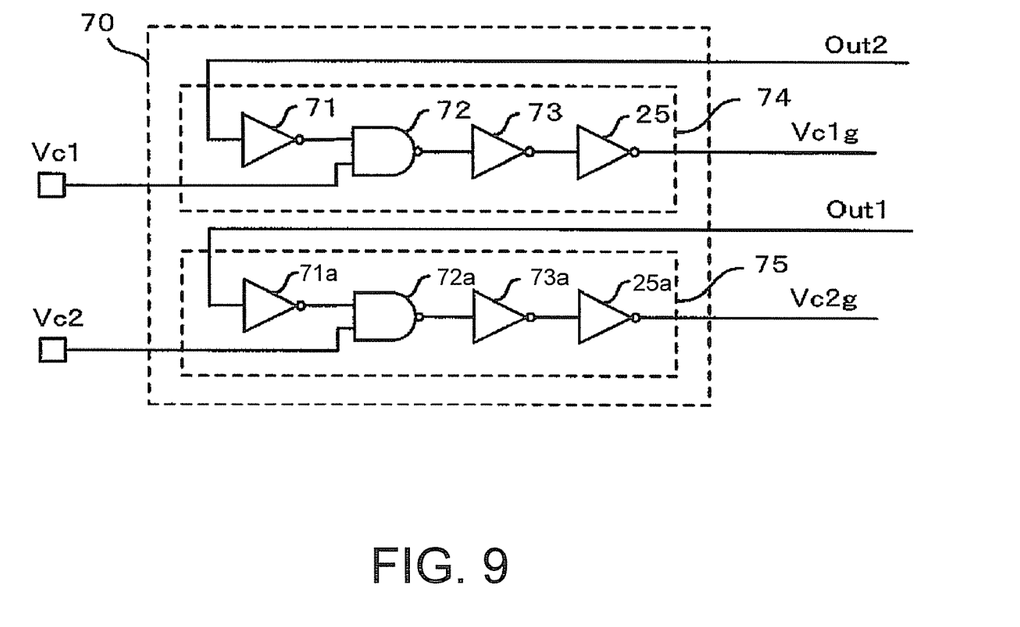
FIG. 9 is a circuit diagram showing a modification of a control signal generating circuit of the magnetic detection circuit according to the second embodiment.

The detection operation control unit 60 may be composed of an NAND circuit. FIG. 9 is a circuit diagram showing a detection operation control unit 70 employing the NAND circuit.

As shown in FIG. 9, the detection operation control unit 70 includes a first control circuit 74 and a second control circuit 75. The first control circuit 74 includes an inverter 71, an NAND circuit 72, an inverter 73, and the inverter 25. The second control circuit 75 includes an inverter 71a, an NAND circuit 72a, an inverter 73a, and the inverter 25a.

The inverter 71 inverts the signal Out2 showing the second detection result. The signal Out2 showing the second detection result, which is reversed by the inverter 71, is inputted to one of input terminals of the NAND circuit 72. The first control signal Vc1 of positive logic is inputted to the other one of the input terminals of the NAND circuit 72. An output from the NAND circuit 72 is inputted to the inverter 73. An output from the inverter 73 is inputted to the inverter 25.

The inverter 71*a* inverts the signal Out1 showing the first detection result. The signal Out1 showing the first detection result, which is reversed by the inverter 71*a*, is inputted to one of input terminals of the NAND circuit 72*a*. The second control signal Vc2 of positive logic is inputted to the other one of the input terminals of the NAND circuit 72*a*. An output from the NAND circuit 72*a* is inputted to the inverter 73*a*. An output from the inverter 73*a* is inputted to the inverter 25*a*.

The magnetic detection circuit according to the above-described embodiment can be operated by the detection operation control unit 70 in FIG. 9.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A magnetic detection circuit to detect a magnetic field of a first polarity and a magnetic field of a second polarity, the magnetic detection circuit comprising a magnetic detection unit and a detection operation control unit, wherein the magnetic detection unit performs first and second magnetic field detection operations;

the first magnetic field detection operation is that a magnetic field is detected according to a first control signal, that whether or not the detected magnetic field is of the first polarity is determined to obtain a first detection result, and that a signal showing the first detection result is stored;

the second magnetic field detection operation is that the magnetic field is detected according to a second control signal, that whether or not the detected magnetic field is of the second polarity is determined to obtain a second detection result, and that a signal showing the second detection result is stored;

the detection operation control unit gates the first control signal and the second control signal so as to allow both of the first and the second magnetic field detection operations to be performed, when both of the signal showing the first detection result and the signal showing the second detection result indicate that the magnetic field is not detected; and further the detection operation control unit gates the first control signal and the second control signal so as to allow only the detection operation of the magnetic field of the detected polarity to be performed, when either one of the signal showing the first detection result and the signal showing the second detection result shows that the magnetic field is detected.

2. The magnetic detection circuit according to claim 1, wherein the magnetic detection unit includes a magnetic detection portion, a detection result storage unit and an electric power control unit, and the detection operation control unit includes first and second control circuits, wherein the magnetic detection portion contains:

a magnetic detection element to generate an electric signal according to a magnetic flux density of the magnetic field;

an amplifying circuit to amplify the output signal from the magnetic detection element;

a switch circuit to reverse the connection between the magnetic detection element and the amplifying circuit according to the first and the second magnetic field detection operations, the switch circuit being connected between the magnetic detection element and the amplifying circuit; and a comparator to compare an output from the amplifying circuit and a reference value so as to output a comparison result, wherein the detection result storage unit contains:

a first storage circuit to store the first detection result; and a second storage circuit to store the second detection result, wherein the first control circuit gates the first control signal according to the second detection result;

wherein the second control circuit gates the second control signal according to the first detection result, and wherein the electric power control unit reduces or stops the electric power to be supplied to the magnetic detection portion when one of the first and the second magnetic field detection operations is stopped.

3. The magnetic detection circuit according to claim 1, wherein the first control circuit outputs the first control signal when the signal showing the second detection result indicates that the magnetic field is not detected, and the second control circuit outputs the second control signal when the signal showing the first detection result indicates that the magnetic field is not detected.

4. The magnetic detection circuit according to claim 1, wherein the first and the second control signals are generated intermittently and alternately.

5. The magnetic detection circuit according to claim 1, wherein the electric power control unit stops an electric power supply at least to the magnetic detection element in response to signals corresponding to the outputs from the first and the second control circuits.

6. The magnetic detection circuit according to claim 1, wherein the magnetic detection element is a Hall element.

7. A magnetic detection circuit comprising:

a magnetic detection element to detect a magnetic field of a first polarity and a magnetic field of a second polarity to output an electric signal;

an amplifying circuit to amplify the output signal from the magnetic detection element;

a switch circuit connected between the magnetic detection element and the amplifying circuit, the switch circuit selectively reversing the polarity of the output voltage from the magnetic detection element to input the output voltage with the reversed polarity to the amplifying circuit;

a comparator to compare the output signal from the amplifying circuit and a reference value;

first and second storage circuits to receive an output signal from the comparator, the first and second storage circuits respectively outputting first and second output signals;

an output circuit to output a magnetic field detection signal based on the first and the second output signals;

an electric power control unit to control at least the electric power to be provided to the magnetic detection element;

a first control circuit to receive a first control signal and the second output signal, the first control circuit generating a first gated signal; and a second control circuit to receive a second control signal and the first output signal, the second control circuit generating a second gated signal, wherein the first and the second control signals are generated intermittently and alternately;

the first and the second gated signals are respectively inputted to the first and the second storage circuits in order to control the first and the second storage circuits;

a first signal based on the first and the second gated signals is supplied to the electric power control unit to control the electric power control unit; and the switch circuit is switched by a second signal corresponding to at least one of the first or the second control signals.

8. The magnetic detection circuit according to claim 7, wherein the second signal corresponding to the at least one of the first and the second control signal is at least one of the first gated signal and the second gated signal.

9. The magnetic detection circuit according to claim 7, wherein the first control circuit outputs the first control signal as the first gated signal when the second output signal from the second storage circuit shows that the magnetic field is not detected, and the second control circuit outputs the second control signal as the second gated signal when the first output signal from the first storage circuit shows that the magnetic field is not detected.

10. The magnetic detection circuit according to claim 7, wherein the first control circuit includes:

a first NOR circuit to receive the first control signal and the second output signal; and a first inverter to reverse an output signal from the first NOR circuit and to supply the reversed output signal to the first storage circuit;

wherein the second control circuit includes:

a second NOR circuit to receive the second control signal and the first output signal; and a second inverter to reverse output signals from the second NOR circuits to supply the reversed output signals to the second storage circuit.

11. The magnetic detection circuit according to claim 7, wherein the first and the second gated signals are inputted to a first NAND circuit, and an output signal from the first NAND circuit is supplied to the electric power control unit.

12. The magnetic detection circuit according to claim 7, wherein the output circuit includes a third NOR circuit.

13. The magnetic detection circuit according to claim 7, wherein at least one of the first and the second control signals or at least one of the first and the second gated signals causes the switch circuit to perform a switching operation to detect the magnetic field of the first polarity and the magnetic field of the second polarity.

14. The magnetic detection circuit according to claim 7, wherein the first and the second storage circuits are first and second D type flip-flops.

15. The magnetic detection circuit according to claim 7, wherein the first and the second storage circuits are third and fourth D type flip-flops having reset terminals respectively, a reset terminal of the third D type flip-flop is connected to an output terminal of the second storage circuit and to the first control circuit, and a reset terminal of the fourth D type flip-flop is connected to an output terminal of the first storage circuit and to the second control circuit.

16. The magnetic detection circuit according to claim 7, wherein wherein the first control circuit includes:

a third inverter to receive the first control signal;

a fourth NOR circuit to receive an output from the third inverter and the second output signal from the second storage circuit; and a fourth inverter to receive an output signal of the fourth NOR circuit and to output the first gated signal, and wherein the second control circuit includes:

a fifth inverter to receive the second control signal;

a fifth NOR circuit to receive an output from the fifth inverter and the first output signal from the first storage circuit; and a sixth inverter to receive an output signal of the fifth NOR circuit and to output the second gated signal.

17. The magnetic detection circuit according to claim 7, wherein the first control circuit includes:

a seventh inverter to receive outputs from the second storage circuit, a second NAND circuit to receive an output signal from the seventh inverter and the first control signal, an eighth inverter to receive an output signal from the second NAND circuit; and a ninth inverter to reverse an output signal from the eighth inverter to output the first gated signal, wherein the second control circuit includes:

a tenth inverter to receive an output signal from the first storage circuit, a third NAND circuit to receive an output signal from the eleventh inverter and the first control signal, a eleventh inverter to receive an output signal from the third NAND circuit; and an twelfth inverter to reverse an output from the eleventh inverter to reverse an output from the eleventh inverter to output the second gated signal.

18. The magnetic detection circuit according to claim 7, further comprising a control signal generating circuit to generate the first and the second control signals, wherein the control signal generating circuit includes:

a fourth NAND circuit to receive an operation execution instruction signal and a selection signal and to output the first control signal;

a thirteenth inverter to receive the operation execution instruction signal;

a sixth NOR circuit to receive an output from the thirteenth inverter and the selection signal; and a fourteenth inverter to receive an output signal from the sixth NOR circuit and to output the second control signal.

19. The magnetic detection circuit according to claim 7, wherein the electric power control unit stops supplying the electric power at least to the magnetic detection element, the electric power control unit receiving the first signal based on the first and the second gated signals.

20. The magnetic detection circuit according to claim 7, wherein the magnetic detection element is a Hall element.

* * * * *